United States Patent [19]
Pengelly et al.

[11] Patent Number: 5,898,913
[45] Date of Patent: Apr. 27, 1999

[54] PLURAL BAND CONVERTER

[75] Inventors: Raymond S. Pengelly, Windham, N.H.; Marc R. Sheade, Cupertino, Calif.

[73] Assignee: Raytheon Company, Lexington, Mass.

[21] Appl. No.: 08/845,749

[22] Filed: Apr. 25, 1997

[51] Int. Cl.$^6$ .................................................. H04B 1/28
[52] U.S. Cl. ........................... 455/326; 455/333; 455/118
[58] Field of Search ...................................... 455/118, 313, 455/318, 323, 326, 330, 333; 327/113

[56] References Cited

U.S. PATENT DOCUMENTS

| | | | |
|---|---|---|---|
| 5,438,693 | 8/1995 | Cox | 455/326 |
| 5,465,420 | 11/1995 | Dougherty et al. | 455/333 |

*Primary Examiner*—Nguyen Vo
*Attorney, Agent, or Firm*—Deborah U. Verga; Glenn H. Lenzen, Jr.

[57] ABSTRACT

A frequency converter employs a balanced bridge mixer of switching elements such as field-effect transistors (FETs) with a local oscillator supplying control signals to gate terminals of the transistors. A carrier at intermediate frequency (IF) or at radio frequency (RF) is modulated for communication of data, and is applied to alternate nodes of the bridge. The remaining bridge nodes supply output signals to respective branches of an output circuit. Each branch of the output circuit is provided with a bandpass filter having a spectral characteristic corresponding to the spectral characteristic of a specific one of plural output signals to be outputted via the branch. Each branch may contain an active element, such as an amplifier, which is activated for outputting a signal, and which is deactivated for when node signal is to be outputted. A switchable impedance circuit is included within each of the branches to present a substantially constant impedance characteristic to the bridge, independently of whether the bridge amplifier is activated or deactivated. The local oscillator may provide plural frequencies, as by use of a variable-frequency oscillator or by use of plural oscillators, to place an output signal within the frequency band of a specific one of the output branches.

14 Claims, 3 Drawing Sheets

5,898,913

PLURAL BAND CONVERTER

BACKGROUND OF THE INVENTION

This invention relates to frequency converters employing a balanced bridge mixer and, more particularly, to a converter having plural output circuit branches connecting to nodes of the bridge mixer, wherein respective ones of the branches have respective filters with differing passband characteristics to pass respective signals of corresponding spectral characteristics while attenuating signals of other spectral characteristics.

Converter circuits are employed in transmitters and receivers of electric signals to provide an up-conversion of frequency and a down-conversion of frequency. The upconversion of frequency is obtained by mixing the signal of a local oscillator (LO) with a signal at intermediate frequency (IF) to obtain a radio frequency (RF) signal, and the down-conversion of frequency is obtained by mixing the RF signal with the LO signal to obtain an IF signal.

A common form of construction of such a converter circuit includes a balanced mixer. The balanced mixer has a bridge with an even number of arms, which are of nonlinear or switching elements, and which are arranged in a ring. Successive ones of the arms are interconnected by circuit nodes. One embodiment of the bridge employs a set of four matched field effect transistors (FETs) wherein the respective gate terminals of the transistors are driven by LO signals to provide alternative states of conduction and nonconduction within the transistors. The LO signal driving one pair of opposed transistors is of opposite phase to the LO signal driving the second pair of opposed transistors. The IF signal in an up-conversion, or the RF signal in a down-conversion, is applied to one pair of opposed nodes, typically by a transformer coupling. In both the case of up-conversion and down conversion, the output signal is obtained from the second pair of opposed nodes, typically by a transformer coupling.

In certain signal processing situations, it is desired to output any one of a plurality of signals wherein the signals are at different frequencies. This may occur, by way of example, wherein individual ones of the output signals are to be transmitted via different signal channels, or with different spectral characteristics and/or signal amplitudes. Alternatively, this may occur, by way of example, wherein received signals are to be processed via different signal channels which may differ in spectral passbands and/or signal power gain.

A problem arises in that, with the previously described construction of a converter, the converter has a single output channel. To accommodate the situation wherein the signal processor circuitry is to output signals in different frequency bands, it is the present practice to employ a plurality of converter circuits, particularly in the situation wherein the signals differ greatly in frequency so as to militate against a single wide band output channel. This is disadvantageous in requiring additional circuitry and additional consumption of direct current (DC) from a power supply. This disadvantage is most notable in the case of portable equipment such as may be carried by a spacecraft or in an electronic device, such as a communication device, carried by a person.

SUMMARY OF THE INVENTION

The aforementioned problem is overcome and other advantages are provided by a plural band frequency converter which, in accordance with the invention, has a balanced bridge with an even number of arms which are arranged in the form of a ring. The arms are joined by circuit nodes. Each of the arms has electronically operable switches for altering the states of conduction within each of the arms of the bridge. In particular, the switch is operable to provide alternatively states of electrical conduction and nonconduction within each of the respective bridge arms. Each switch has a control terminal by which an electric control signal is applied for activation of the switch. In a preferred embodiment of the invention, the bridge has four arms joined by four nodes, and the switch of each arm comprises an FET. The gate terminal of each FET serves as the control terminal.

The bridge is activated by plural sources of excitation. A first of the excitation sources is an oscillation circuit outputting a first signal at a first frequency, and a second of the excitation sources is a signal generator outputting a second signal at a second frequency different from the first frequency. The second signal comprises a carrier modulated with data. Signals are extracted from the bridge by means of an output circuit having a plurality of branches connecting with a plurality of the bridge nodes, the remaining ones of the bridge nodes being available for connection to one of the excitation sources. The other of the excitation sources connects with the control terminals of the switches.

In a preferred embodiment of the invention, there are two of the excitation sources, namely, the oscillation circuit providing an RF signal and the signal generator producing an IF signal. In the IF signal, data is modulated onto an IF carrier by means of phase or amplitude modulation, by way of example. The oscillation circuit drives the gate terminals, and outputs a pair of antiphase signals so as to drive alternate ones of the pairs of opposed transistors into states of conduction and nonconduction. The signal generator connects with half of the nodes and the output circuit connects with the other half of the nodes. In the preferred embodiment of the invention, a pair of opposed nodes is connected to the signal generator, and the remaining pair of opposed nodes connects with the output circuit. In the output circuit, one of the two branches connects with one of the nodes, and the second of the two branches connects with the remaining node.

Each branch of the output circuit has an impedance adaptation circuit which enables the branch to provide essentially the same impedance to the bridge, whether the branch be utilized or not utilized. By way of example in the utilization of the branch, the branch may contain an amplifier which is de-energized when the branch is in a state on non-use. In the preferred embodiment of the invention, each of the branches includes a switch for switching between the amplifier and a fixed impedance for presenting a substantially constant value of impedance to the bridge. The switching aspect of the impedance adaptation circuit can be deleted in a branch in the event that its amplifier presents substantially the same circuit loading in the event of activation or deactivation of the amplifier.

In addition, each of the branches of the output circuit includes a bandpass filter having a spectral characteristic corresponding to the spectral characteristic of a signal being outputted by the branch. This permits a specific form of signal, in terms of its frequency and other spectral characteristics, to be outputted by one of the branches while being attenuated by another of the branches. The oscillation circuit may include a plurality of oscillators or a variable frequency oscillator so as to vary the frequency of a signal outputted to the output circuit, thereby to place selectively the output signal in one of the branches of the output circuit. The invention is particularly useful for integrated circuits using any type of suitable semiconductor technology such as GaAs MESFET, pHEMT, HBT, SiBJT, SiGe or BiCMOS.

BRIEF DESCRIPTION OF THE DRAWING

The aforementioned aspects and other features of the invention are explained in the following description, taken in connection with the accompanying drawing figures wherein.

Identically labeled elements appearing in different ones of the figures refer to the same element but may not be referenced in the description for all figures.

DETAILED DESCRIPTION

Figure 1:
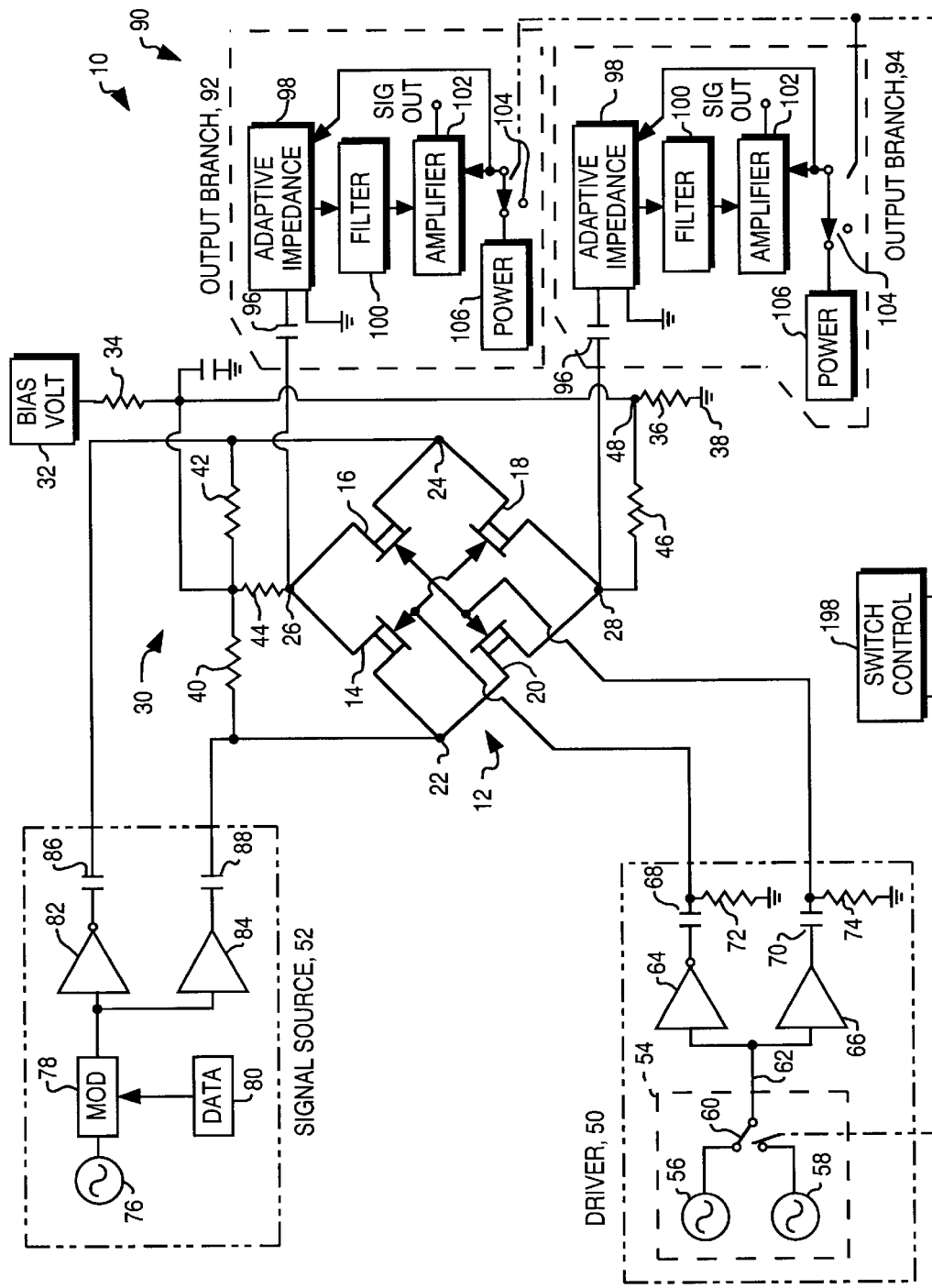
FIG. 1 is a diagram of electrical circuitry of the frequency converter of the invention.

With reference to FIG. 1, the frequency converter 10 of the invention comprises a balanced mixer bridge 12 of four arms each of which has a transistor, the transistors being identified as transistors 14, 16, 18 and 20. Preferably, the transistors 14, 16, 18, and 20 are depletion mode FETs. Nodes 22, 24, 26, and 28 interconnect successive ones of the transistors, 14, 16, 18, and 20 in the configuration of a ring. A bias-voltage circuit 30 provides DC (direct current) bias voltage of equal value to all of the nodes 22, 24, 26, and 28 of the bridge 12. The bias circuit 30 comprises a source 32 of bias voltage, and two resistors 34 and 36 which are connected serially from the voltage source 32 to ground 38. Also included within the bias circuit 30 are four resistors 40, 42, 44, and 46 which connect respectively from the bridge nodes 22, 24, 26, and 28 to a common junction point 48 between the bias resistors 34 and 36. The resistors 34 and 36 establish a voltage of 0.65 volts, or other suitable voltage, at the junction point 48 to maintain operating levels for operation of the bridge transistors 14, 16, 18, and 20 as will be explained below.

Also included within the circuitry of FIG. 1 are a driver 50 and a signal source 52 which provide input signals to the bridge 12. The driver 50 comprises a local oscillator 54 which is capable of providing a plurality of frequencies and which, by way of example, may include two oscillators 56 and 58 outputting their signals via a selector switch 56 to a common output line 62. Also included within the driver 50 are two amplifiers 64 and 66, two capacitors 68 and 70, and two resistors 72 and 74. The signal on line 62 is coupled via amplifier 64 and capacitor 68 to drive the gate terminals of the transistors 14 and 18, the signal on line 62 being coupled via the amplifier 66 and capacitor 70 to drive the gate terminals of the transistors 16 and 20. Both of the amplifiers 64 and 66 amplify the signal on line 62 to a sufficient amplitude for driving the respective transistors, the amplifier 64 being an inverter for inverting the phase of the drive signal so that the signals outputted by the amplifiers 64 and 66 are of opposite phase. The junction between the capacitor 68 and the gates of the transistors 14 and 18 is grounded via resistor 72, and the junction between capacitor 70 and the gates of the transistors 16 and 20 is grounded via the resistor 74. The capacitors 68 and 70 provide for AC (alternating current) coupling of signals between the amplifiers 64 and 66 with the respective transistors of the bridge 12.

In the biasing of the transistors 14, 16, 18, and 20 of the bridge 12 with respect to ground, it is noted that the resistors 72 and 74 maintain a DC voltage of zero volts for the gate terminals of all of the bridge transistors 14, 16, 18, and 20. As noted above, the connection of the bridge nodes via the resistors 40, 42, 44 and 46 to the junction point 48 maintains these nodes at a value of 0.65 volts, or other suitable voltage. This is the threshold voltage between the operational states of conduction and nonconduction of the transistors of the bridge 12. Thereby, the AC drive signals outputted by the driver 50 have positive and negative voltage excursions about the threshold level of the bridge transistors for enhanced performance of the bridge 12.

The signal source 52 provides a signal in the form of a carrier which is modulated with data by means of phase modulation or amplitude modulation, by way of example. Accordingly, the source 52 is shown in FIG. 1 as comprising an oscillator 76, a modulator 78, a source of data 80 which outputs data bearing signals to the modulator 78, two amplifiers 82 and 84 of which the amplifier 82 includes an inverting function, and two capacitors 86 and 88. In the operation of the signal source 52, a carrier signal provided by the oscillator 76 is modulated at the modulator 78 by the signals of the data source 80. The modulated carrier signal outputted by the modulator 78 is applied via the amplifier 82 and capacitor 86 to the bridge node 24, and is applied also via the amplifier 84 and capacitor 88 to the bridge node 22. In view of the inverting function of the amplifier 82, the signals provided by the amplifiers 82 and 84 are 180 degrees out of phase so as to place node 24 alternately with a positive and a negative voltage relative to the node 22.

The converter 10 further comprises an output circuit 90 having a first branch 92 and a second branch 94. The first branch 92 connects between the bridge node 26 and ground, and the second branch 94 connects between the bridge node 28 and ground. During operation of the bridge 12, the driver 50 places opposed pairs of transistors, namely, the pair of transistors 14 and 18 and the pair of transistors 16 and 20, alternately in states of conduction and nonconduction. Therefore, there is always a conductive path through the bridge 12, via the pairs of bridge transistors in the conducting state and between the nodes 26 and 28, via the bias circuit 30, and also via the output branches 92 and 94 of the output circuit 90. Thereby, there is always a conductive path available for receiving the AC signals outputted via the capacitors 86 and 88 of the signal source 52.

The specific frequencies of signals outputted by the source 52 and driver 50 are chosen in accordance with the specific situation which the converter 10 is to be employed. By way of example, the converter 10 may be employed for up-conversion of frequency to provide an RF signal to be outputted by one of the branches 92 and 94. In such case, the driver 50 may be operated at a frequency of, by way of example, 2 GHz (gigahertz). The source 52 would output an IF signal of, by way of example, 100 MHz (megahertz). Thereby, an input signal generated by the source 52 at IF would be outputted at RF by the output circuit 90. Both sum and difference signals are produced by operation of the bridge 12. Accordingly, one of the output branches 92 and 94 would be tuned to pass the signal at the desired output frequency. Alternatively, the converter 10 can be operated for down-conversion in which case a signal provided by the source 52 would be at a frequency of, by way of example, 2.5 GHz, and the signal outputted by the bridge 12 would be an IF signal having a frequency of 500 MHz. One of the output branches 92 and 94 would be tuned to receive the output signal of 500 MHz.

A feature of the invention is the fact that only one of the output branches 92 and 94 need be tuned to receive the output signal. The other of the output branches 92 and 94 may be tuned to some other frequency for which there may be a desire to output the other frequency at a later time.

Continuing with the preceding example, in the event that the signal source were to output an RF signal of 2.4 GHz, the outputted IF signal would be at 400 MHz. Thus, the branch 92 might be tuned to the IF frequency of 500 MHz and the branch 94 might be tuned to the IF frequency of 400 MHz. Similarly, in the case of the up-conversion, the driver 50 may be operated with the oscillator 56 providing the frequency of 2.0 GHz and the oscillator 58 providing a frequency of 1.0 GHz. Assuming that the IF signal of the source 52 is at a frequency of 100 MHz, one could obtain output signals at frequencies of 2.1 GHz or 1.1 GHz depending on selection, by the switch 60, of the oscillator 56 or the oscillator 58.

In the output circuit 90, each of the branches 92 and 94 comprises a capacitive coupling circuit represented by capacitor 96, an adaptive impedance unit 98, a filter 100, an amplifier 102, and a connection of the amplifier 102 by way of a switch 104 to a power source 106. In the first output branch 92, a signal outputted by the bridge node 26 passes via the capacitor 96 into the adaptive impedance unit 98. The adaptive impedance unit 98 has a connection to ground for completing a signal path between the bridge node 26 and ground. Similarly, in the case of a signal outputted by the bridge node 28, this signal is outputted to the branch 94 wherein the signal is coupled via the capacitor 96 to the adaptive impedance unit 98. By virtue of the ground connections of the adaptive impedance units 98 in each of the output branches 92 and 94, there is provided the aforementioned signal path by which an AC signal can propagate from the bridge node 26 through both of the branches 92 and 94 back to the bridge node 28. Similarly, a signal may propagate in the reverse direction from the bridge node 28 via the branches 92 and 94 to the bridge node 26.

In each of the branches 92 and 94, the adaptive impedance unit 92 outputs the signal via the filter 100 to the amplifier 102. The amplifier 102 has a terminal for outputting the signal to further utilization circuitry, not shown. The major source of the consumption of power in each of the output branches 92 and 94 is the amplifier 102. Accordingly, power is applied from the power source 106 via the switch 104 to the amplifier 102 only at such times as when the amplifier 102 is to output a signal, the switch 104 being repositioned in the off position for disconnection of the power source 106 during times when the amplifier 102 is to be inactive. This provides for a considerable conservation of power by the converter 10.

In the practice of the invention, it is recognized that the input impedance of a transistor amplifier, such as the amplifier 102, varies in accordance with voltages and currents found within an input transistor of the amplifier. In a preferred embodiment of the invention, the amplifier 102 comprises FETs, as will be shown in FIG. 2, and the activation and deactivation of the amplifier 102 results in a change of impedance reflected back towards the bridge 12. As will be described in FIG. 2, the adaptive impedance unit 98 includes electronically switchable elements, responsive to the position of the switch 104, for altering the value of impedance reflected back to the bridge 12, so as to compensate for changes in impedance resulting from the activation and deactivation of the amplifier 102. Thereby, the bridge node 26 views a substantially constant impedance relative to ground independently of the state of activation of the amplifier 102 in the output branch 92. Similarly, the bridge node 28 sees a substantially constant impedance relative to ground at the output branch 94 independently of the state of activation of the amplifier 102. Preferably, the impedance presented by each of the adaptive impedance units 98 to the bridge 12 should be equal or substantially equal, so as to insure that the bridge 12 can operate in a substantially balanced condition.

As noted above, the output branches 92 and 94 can be operative with different signals at different frequencies and at different times. Therefore, the filter 100 of the first branch 92 is tuned to a frequency different from that of the filter 100 of the second branch 94. In addition, each of the filters 100 of the respective branches 92 and 94 is provided with a spectral characteristic corresponding to the spectrum of the signal which is to be applied to the filter 100. Also, the amplifiers 102 in the respective branches 92 and 94 may be provided with different values of power gain and/or voltage output in correspondence with the specific circuitry (not shown) to be driven by the converter 10.

Figure 3:
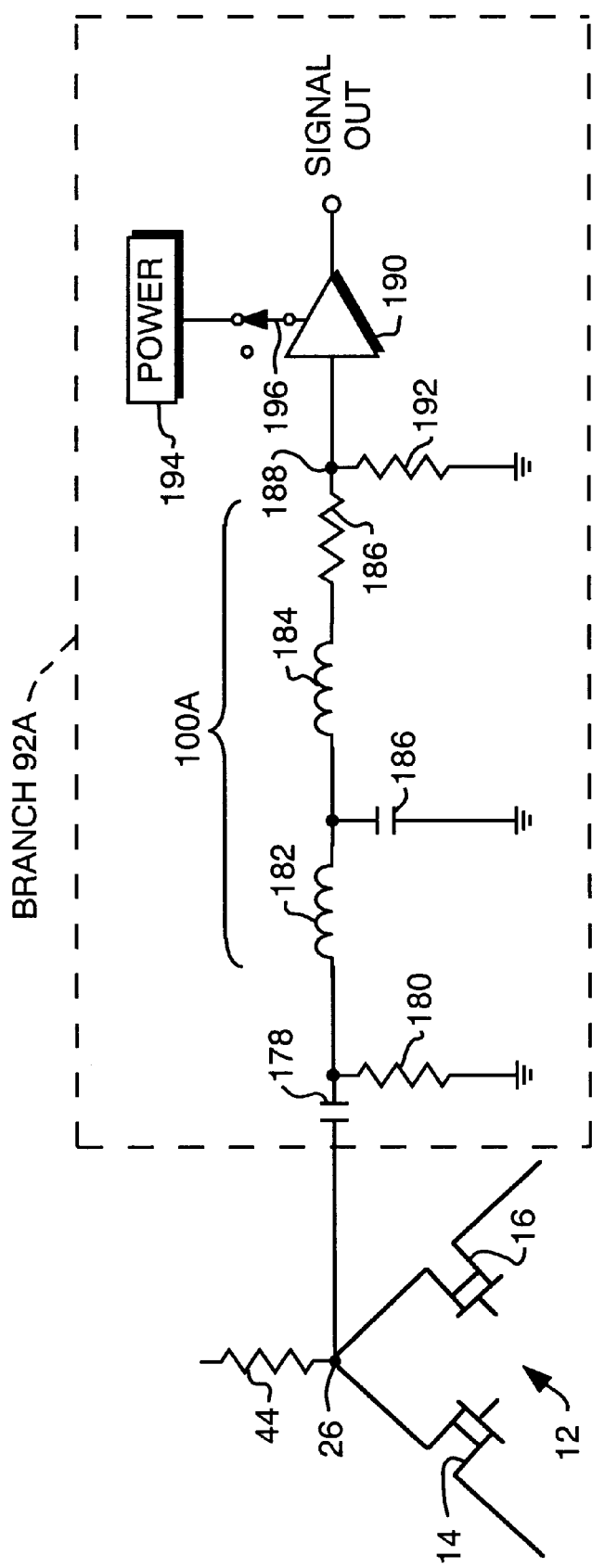
FIG. 3 shows a configuration of a branch of output circuit having a fixed impedance.

By way of further example in the operation of the converter 10, it is noted that there may be situations of use of the converter 10 wherein accurate generation of an output signal is required for only one of the output branches such as the branch 92, while the other output signal, such as that outputted by branch 94, does not have to meet close tolerances in its signal characteristics, such as spectral passband or amplitude. In such a case, the circuitry of FIG. 1 can be simplified by replacement of the adaptive impedance unit 98 in the output branch 92 with a fixed value of impedance, the fixed impedance having the requisite value for balancing the bridge 12 in the situation wherein the amplifier of the branch 92 is activated. Such a construction of output branch 92 is shown in FIG. 3. Thereby, during operation of the first branch 92 to produce the high-fidelity signal, the adaptive impedance unit 98 of the second branch 94 is providing the correct value of impedance for balanced operation of the bridge 12. However, during operation of the second branch 94 to output the low-fidelity signal, the impedance of the deactivated amplifier of the first branch 92 is reflected back to the bridge 12 resulting in a less than optimum balance for the bridge 12.

Figure 2:
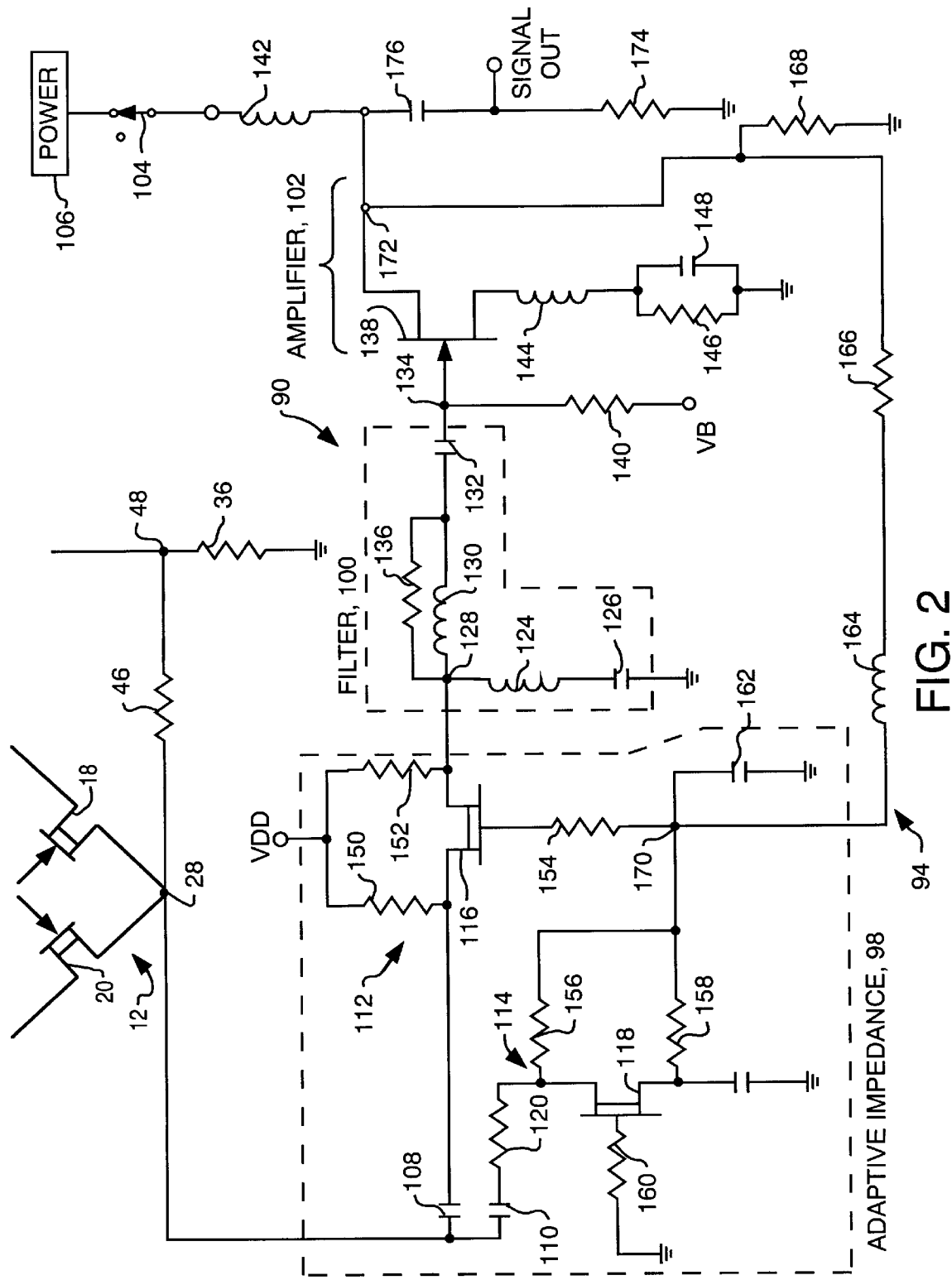
FIG. 2 is an electrical schematic diagram of a branch of an output circuit of FIG. 1.

With reference to FIG. 2, there is shown an electrical schematic diagram of one of the output branches of the output circuit 90, the second branch 94 being shown, by way of example. The AC coupling provided by the capacitor 96 of FIG. 1 is implemented in FIG. 2 by means of two capacitors 108 and 110. The adaptive impedance unit 98 comprises a series switch 112 and a parallel switch 114. The series switch 112 comprises a transistor 116 which, when in a conductive mode, couples signals from the capacitor 108 to the filter 100. The parallel switch 114 comprises a transistor 118 which, when in a conductive mode, couples signals from the capacitor 110 via a resistor 120 and a capacitor 122 to ground. The resistor 120 is connected between a drain (source) terminal of the transistor 118 and the capacitor 110. The capacitor 112 is connected between a source (drain) terminal of the transistor 118 and ground. Each of the transistors 116 and 118 is fabricated, preferably, as a depletion mode FET. As will be described subsequently, the switches 112 and 114 are operated in alternating fashion such that, during a conductive state of the switch 112, the switch 114 is in a state of nonconduction, and that during a state of nonconduction of the switch 112, the switch 114 is in a state of conduction. Thereby, a signal at the bridge node 28 is coupled via the capacitor 108 and the switch 112 to the filter 100 or, alternatively, is coupled via the capacitor 110 and the switch 114 to ground.

During the conductive state of the parallel switch 114, there is a serial combination of the impedances of the capacitor 110 and 122 plus the resistance of the resistor 120 and the resistance of the transistor 118 in its conductive state to present an input impedance of the second branch 94 to the bridge node 28. When the series switch 112 is in its conductive state, the impedance of transistor 108 plus the impedance of the transistor 116 in its conductive state and the impedance of the filter 110 plus the input impedance of the amplifier 102 provide the input impedance of the output branch 94 for presentation to the bridge node 28. The two values of input impedance, as noted above, are equal or substantially equal to insure balanced operation of the bridge 12. The filter 100 comprises a series combination of inductor 124 and capacitor 126 connecting between an input terminal 128 of the filter 100 and ground. The filter 100 further comprises a series connection of an inductor 130 and a capacitor 132 connected between the input terminal 128 and an output terminal 134 of the filter 100. A resistor 136 is connected in parallel with the inductor 130. Such a configuration of filter is well known, and may be tuned to provide a desired spectral passband with appropriate selection of values of inductance, capacitance, and resistance in a well-known manner.

The amplifier 102 comprises a transistor 138, preferably an enhancement mode FET, of which the gate terminal connects via the terminal 134 to a resistor 140 for receiving bias voltage from a bias voltage source VB. The drain terminal of the transistor 138 connects via an inductor 142 to the switch 104 for receiving power from the power source 106. The source terminal of the transistor 138 connects via a circuit to ground, the circuit having a serial connection of inductor 144 in series with a resistor 146, the resistor 146 being in parallel with a capacitor 148.

Bias voltage for the transistor 116 of the series switch 112 is provided by a set of three resistors 150, 152, and 154. Bias voltages for the transistor 118 of the parallel switch 114 are provided by a set of three resistors 156, 158, and 160. Further bias circuitry includes a capacitor 162, an inductor 164, a resistor 166, and a resistor 168. The source and the drain voltages for the transistor 116 are provided by the resistors 150 and 152 which connect respectively from these terminals to a voltage source VDD. The gate voltage for the transistor 116 is provided by the resistor 154 which connects with a circuit node 170. The drain and the source terminals of the transistor 118 are provided with their respective voltages by the resistors 156 and 158 which connect with the node 170. The capacitor 162 connects the node 170 to ground for passage of AC components of electrical signals which may be present thereon. The capacitor 162 does not effect the value of the DC bias voltage which is present at the node 170. Similarly, the inductor 164 prevents the passage of any AC component of voltage from the node 170 to the resistor 166, and also blocks from the node 170 any AC signal outputted by the transistor 138 and appearing at a circuit node 172. The series connection of inductor 164, resistor 166, and the resistor 168 serve to ground the node 170 in the absence of any voltage being provided by the power source 106. Thus, in an open condition of the switch 104, the node 170 is biased to ground. However, in a closed condition of the switch 104, the node 170 is provided with the voltage of the power source 106.

Thereby, there are two possible values of bias voltages for each of the transistors 116 and 118, depending on the state of the switch 104. In particular, it is noted that, upon a grounding of the node 170, the gate voltage of the transistor 116 is much less than the source and the drain voltages. Accordingly, the transistor 116 is in a state of nonconduction. However, upon a closing of the switch 104, the gate voltage of the transistor 116 is equal or approximately equal to the source and the drain voltages so as to place the transistor 116 in a state of conduction. In the practice of the invention, the voltage outputted by the power source 106 is to be equal or nearly equal to the voltage provided at VDD. In the case of the transistor 118, the closure of the switch 104 provides the source and the drain terminals with substantially more positive voltage than the voltage of the gate terminal, this resulting in a state of nonconduction of the transistor 118. Upon an opening of the switch 104, the grounding of the node 170 essentially equalizes the voltages of the three terminals of the transistor 118 to place the transistor 118 in a state of conduction.

In the operation of the amplifier 102, the inductor 142 provides a relatively high impedance to signals at a high frequency, such as at RF, while providing a low resistance to DC current which activates the transistor 138. Similarly, the inductor 144 presents a relatively high impedance to RF signals while presenting essentially zero resistance to DC current flow. The capacitor 148 bypasses any RF signal past the resistor 146 to ground. An RF signal appearing at the gate of the transistor 138 induces an RF current flow through the transistor 138 with the generation of a resultant RF voltage at the circuit node 172 between the transistor 138 and the inductor 142. The output impedance of the amplifier 102 is provided by a resistor 174 connected between an output signal port and ground. A capacitor 176 connects the node 172 to the output signal port to provide a path for conduction of the AC signal from the output of the transistor 138 to the output signal port.

In the operation of the branch 94 of the output circuit 90, the closure of the switch 104 provides power to both the transistor 138 and to the bias circuitry of the transistors 116 and 118. Therefore, during activation of the amplifier 102, an input signal from the bridge node 28 passes through the series switch 112 to be amplified by the amplifier 102. On an opening of the switch 104, power is terminated from both the amplifier 102 and the bias circuitry of the transistors 116 and 118. Accordingly, any AC signal appearing at the bridge node 28 is shunted to ground by the parallel switch 114 and blocked from both the filter 100 and the amplifier 102 by the switch 112. Thereby, the switch 104 controls both the activation of the amplifier 102 and the operation of the series and the parallel switches 112 and 114.

The entire circuitry of the converter 10 is built as a microwave monolithic integrated circuit (MMIC), thereby reducing space and weight requirements from such requirements of circuits which employ wire wound coils and/or discreet components. In addition, this form, of construction reduces power consumption. Power consumption is also reduced by the selective activation and deactivation of the amplifier 102.

With reference to FIG. 3, there is shown an output branch 92A which is an alternative embodiment to the branch 92 disclosed in FIG. 1. As disclosed hereinabove, a simplification of one of the output branches can be made in the situation wherein high fidelity is required for only one of the output branches. Therein, by way of example, it is assumed that the signal of the output branch 92A requires the high fidelity which is attained by use of the adaptive impedance 98 in the output branch 94 (FIG. 1). However, since the output branch 94 does not require, in this example, a high fidelity signal, the adaptive impedance feature has been deleted in the circuitry of the output branch 92A. The AC coupling represented by the capacitor 96 in FIG. 1 is provided in FIG. 3 by capacitor 178. A resistor 180 in FIG. 3 replaces the adaptive impedance 98 of FIG. 1. The filter 100 of FIG. 1 as represented in FIG. 3 by a filter 100A having two serially connected inductors 182 and 184, a capacitor 186 connecting a junction of the two inductors 182 and 184 to ground, and a resistor 186. The resistor 186 connects the inductor 184 to an output terminal of the filter 100A at node 188. Node 188 serves also as the input terminal of an amplifier 190 and is grounded via a resistor 192. The resistor 180 grounds the junction between the capacitor 178 and the inductor 182. Electric power for operation of the amplifier 190 is provided by a power source 194 via switch 196.

In the operation of the branch 92A of FIG. 3, a closing of the switch 196 provides power from the source 194 for activation of the amplifier 190. Thereupon, the amplifier 190, upon receipt of a signal at the node 188, amplifies the signal to provide an output signal of the branch 92A. The other components of the output branch 92A are passive components and draw no power during a deactivation of the output branch 92A. A signal outputted by the bridge node 26 is coupled via the capacitor 178 to appear across the resistor 180. The signal is filtered by the filter 100A to provide a filtered signal at the node 188. The filter has the configuration of a T wherein the inductors 182 and 184 serve as arms of the T, and the capacitor 186 serves as the leg of the T. The resistor 186, being in series with the inductor 184, serves to control bandwidth of the filter 100A. Such a construction of filter is well known, and the selection of appropriate component values to obtain a desired filter characteristic is also well known, and need not be described further herein for the practice of the invention. Operation of the switch 104 of the first output branch 92 (or the switch 196 of the branch 92A), operation of the switch 104 of the second output branch 94, and operation of the switch 60 of the local oscillator 54 may be synchronized by a controller 198 shown in FIG. 1.

By way of example in the operation of the invention in accordance with the circuitry of FIGS. 1, 2 and 3, various frequency bands may be employed in the description.

By way of example of three widely used frequency bands, there is a PCS (personal communication system) band occupying approximately 1700–1950 MHz, a satellite band at approximately 1600 MHz, and a cellular telephony band of approximately 800–900 MHz. In the following example of suitable component values for construction of the circuitry, it is assumed that the output branch 92A operates in the cellular telephony band of 800–900 MHz, and that the output branch 94 operates at the PCS band of 1700–1950 MHz. For this purpose, the signal source 52 (FIG. 1) provides a carrier frequency at approximately 130 MHz, and in the driver 50, the oscillator 56 provides a frequency of approximately 966 MHz for the cellular telephony operation and the oscillator 58 provides a frequency of approximately 1.75 GHz for the PCS operation. The filter 100A (FIG. 3) is provided with a passband for the 800–900 MHz cellular telephony range, and the filter 100 (FIG. 2) is provided with a passband for operation at the 1700–1950 MHz PCS band.

In the bridge 12, the resistors 40, 42, 44, and 46 are each provided with values of 4.6 Kohm (kilo-ohm). The transistors 14, 16, 18, and 20 have a resistance of approximately 10 ohms in a state of conduction between the source and the drain terminals of the respective transistors. The transistors 14, 16, 18, and 20 have a resistance of approximately 5000 ohms in a state of non-conduction between the source and drain terminals of the respective transistors. In the branch 92A of FIG. 3, the capacitor 178 has a value of 10 pF (picofarad). The resistors 180 and 186 have values of 250 ohms and 0.1 ohm, respectively. The inductors 182 and 184 have values of 10 nH (nanohenry) and 14 nH, respectively. The capacitor 186 has a value of 2.7 pF. The output impedance of the filter 100A presented to the amplifier 190 is provided by the resistor 192 which has a value of 50 ohms.

With respect to the adaptive impedance 98 of FIG. 2, the resistors 156, 158, 150, and 152 have values in the range of approximately 5–10 Kohm. The electrical characteristics of the transistors 116 and 118 have approximately the same electrical characteristics as the transistors of the bridge 12. The resistors 160 and 154 have values of 1 Kohm and 10 Kohm, respectively. The resistor 120 has a value of approximately 100 ohms. The capacitors 108 and 110 have values of 1.5 pF and 10 pF, respectively. Each of the capacitors 122 and 162 have values of 10 pF. In the filter 100, the resistor 136 has a value of 150 ohms, the inductors 130 and 124 have values of 2.3 nH and 9 nH, respectively. The capacitors 132 and 126 have values of 5 pF and 10 pF, respectively. At the amplifier 102, the resistors 140 and 146 have values of approximately 10 Kohms and 31 ohms, respectively. The inductor 144 has a value of approximately 3.8 nH, and the capacitor 148 has a value of approximately 20 pF. The inductor 142 has a value of 8.2 nH, the capacitor 176 has a value of 0.6 pF, and the resistor 174 has a value of 50 ohms.

The bias voltage source 32 (FIG. 1) outputs a voltage of 3.6 volts, and the bias voltage VB (FIG. 2) has a value of 0.3 volts. Each of the power sources 106 and 194 (FIGS. 2 and 3) provides a voltage of 3.6 volts, this being equal to the value of voltage at VDD provided to the adaptive impedance unit 98 of FIG. 2. The circuitry has been implemented, in the case of the preferred embodiments of the invention, by using 0.5 micron enhancement-depletion mode GaAs MESFET technology but could also be implemented using pHEMT technology or HBT technology. The output impedance of the driver 50 (FIG. 1) has an output impedance of 50 ohms for driving the bridge 12. The circuitry of the invention can be constructed also by use of bipolar (homojunction and heterojunction) and MOS circuits. The input impedance of each of the output branches 92 (or 92A) and 94 is approximately 130 ohms, this appearing in series by virtue of the aforementioned current flow, from the branch 92 via ground to the branch 94, to give a total impedance of 260 ohms presented by the output circuit 90 to the bridge 12.

It is to be understood that the above described embodiments of the invention are illustrative only, and that modifications thereof may occur to those skilled in the art. Accordingly, this invention is not to be regarded as limited to the embodiments disclosed herein, but is to be limited only as defined by the appended claims.

What is claimed is:

1. A plural band converter, comprising:
   a balanced bridge having an even number of arms arranged in the form of a ring and having circuit nodes joining successive ones of the arms, each of said arms having electronically operable switch means providing plural states of electrical conduction, each of said switch means having a control terminal;
   plural sources of excitation for activating said bridge, a first of said excitation sources being an oscillation means outputting a first signal at a first frequency and a second of said excitation sources being a signal generation means outputting a second signal at a second frequency, said second signal comprising a carrier modulated with data, said first frequency differing from said second frequency;
   output circuit means having a plurality of branches, individual ones of said branches being connected to respective nodes of a first set of said nodes;
   wherein one of said first and said second excitation sources connects with control terminals of a plurality of said switch means and the other of said first and said second excitation sources connects with a second set of said nodes;

said first set of nodes comprises a first plurality of said nodes located symmetrically at opposite sides of said ring, and said second set of nodes comprises a second plurality of said nodes, different from said first plurality of nodes, located symmetrically at opposite sides of said ring; and said signal generation means is capable of outputting signals having different spectral characteristics, and individual ones of said branches of said output circuit means have respective filtering means with spectral characteristics corresponding respectively to the spectral characteristics of the signals outputted by said signal generation means.

2. A converter according to claim 1 wherein an individual one of said branches of said output circuit means has impedance adaptation means and means for de-energizing the branch, said impedance adaptation means adapting input impedance to the branch to maintain substantially a same value of impedance during states of energization and de-energization of the branch.

3. A converter according to claim 2 wherein said plural states of electrical conduction include a state of conduction and a state of nonconduction, the converter further comprising a controller for alternate activation of the de-energization means in respective ones of said branches for selectively energizing one of said branches while de-energizing another of said branches.

4. A converter according to claim 3 wherein there are two of said branches and four of said arms, all of said switch means of said arms are driven by said oscillation means, said signal generation means is connected to two of said nodes, and said output circuit means is connected to two of said nodes.

5. A converter according to claim 3 wherein said oscillation means is operative to provide alternatively a plurality of values to said first frequency, said oscillation means being connected to said controller for supplying respective ones of said values of said first frequency in correspondence with selective energization of said branches of said output circuit means.

6. A converter according to claim 3 wherein said filtering means, in any one of said branches, serves to attenuate a signal having a frequency lying within a passband of the spectral characteristic of another of said branches.

7. A plural band converter, comprising:

a balanced mixer bridge comprising a plurality of bridge elements arranged in a ring, the bridge having a first pair of terminals for receipt of an input signal and a second pair of terminals for providing an output signal;

drive means for driving the bridge elements to produce periodic variations in their electrical conductivity;

an output circuit connected to said second pair of terminals, said output circuit comprising two output branches serially connected between said second pair of terminals; and wherein at least one output branch of said output branches has an active element and a variable impedance circuit for maintaining a value of an input impedance of said one output branch independently of states of activation and deactivation of said active element.

8. A converter according to claim 7 wherein input impedances of respective ones of said output branches are substantially equal.

9. A converter according to claim 7 wherein each of said output branches has means for filtering a signal passing through the output branch, the spectral characteristics of the filtering means of one of said output branches differing from the spectral characteristics of the filtering means of another of said branches.

10. A converter according to claim 9 further comprising means for selectively activating and deactivating the active element in at least one of said branches.

11. A converter according to claim 9 wherein each of said output branches comprises an active element, the converter further comprising means for selectively controlling states of activation of the active element of respective ones of said output branches.

12. A converter according to claim 9 wherein said drive means outputs a periodic signal to control states of conduction of said bridge elements, and said drive means includes means for selecting a frequency of said periodic signal from one of a plurality of frequencies to establish an output frequency for the output signal of said bridge, the value of the output frequency being equal to an arithmetic combination of the frequency of the signal of the drive means and the frequency of an input signal applied to the first pair of bridge terminals, the filtering means in one of said output branches being tuned to accept the output frequency and the filtering means in another of said output branches being tuned to reject the output frequency.

13. A converter according to claim 7 wherein each of said output branches comprises an active element, the active element in each of said output branches providing signal amplification wherein the amplification gain in one of said output branches differs from the amplification gain in a another of said output branches.

14. A converter according to claim 13 wherein, in each of said output branches, a state of activation of the active element is established by an application of electric power to said active element, and a state of operation of said variable impedance circuit is established by said application of electric power.

* * * * *